United States Patent
Surendranath et al.

(10) Patent No.: US 7,667,501 B2
(45) Date of Patent: Feb. 23, 2010

(54) CORRELATED DOUBLE SAMPLING TECHNIQUE

(75) Inventors: Nagesh Surendranath, Bangalore (IN); Dipankar Mandal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/051,839

(22) Filed: Mar. 19, 2008

(65) Prior Publication Data

US 2009/0237121 A1    Sep. 24, 2009

(51) Int. Cl.
*H03K 5/00* (2006.01)
(52) U.S. Cl. .................. 327/94; 327/337; 327/554; 341/122
(58) Field of Classification Search .................. 327/91, 327/93–97, 99, 554; 341/122–125
See application file for complete search history.

(56) References Cited

U.S. PATENT DOCUMENTS

| | | | | |
|---|---|---|---|---|
| 6,069,505 A | * | 5/2000 | Babanezhad | 327/156 |
| 6,791,378 B2 | * | 9/2004 | Rossi | 327/124 |
| 2004/0232948 A1 | * | 11/2004 | Rossi | 327/94 |

* cited by examiner

*Primary Examiner*—Long Nguyen
*Assistant Examiner*—Shikha Goyal
(74) *Attorney, Agent, or Firm*—John J. Patti; Wade J. Brady, III; Frederick J. Telecky, Jr.

(57) ABSTRACT

A sampling circuit according to correlated double sampling to generate a difference of two voltages at a sampling node, with the second voltage representing the sum of an input signal and an offset, and the first voltage representing the offset alone. In an embodiment, a first capacitor is charged to the first voltage in a first phase. A second capacitor is then charged to the second voltage in a second phase. In a third phase, the first capacitor is coupled to the input terminal of the amplifier and the second capacitor is coupled between the input and output terminals of the amplifier to cause the amplifier to generate the difference of the first and second voltages. The first capacitor has a capacitance much less than the second capacitor, thereby minimizing the noise power at the output of the amplifier.

6 Claims, 6 Drawing Sheets

CORRELATED DOUBLE SAMPLING TECHNIQUE

BACKGROUND

1. Field of the Technical Disclosure

The present disclosure relates generally to sampling circuits, and more specifically to an improved correlated double sampling technique.

2. Related Art

Correlated double sampling (CDS) generally refers to a sampling technique in which the strength of a signal at a node is determined as a difference of a strength at the node when the signal is coupled to the node and a strength at the node when the signal is decoupled from (or in general, not provided to) the node. CDS is often employed when the node may contain unknown non-signal components which can be treated as an offset or low frequency noise, as is well known in the relevant arts.

As an example, correlated double sampling is often employed in imaging systems that use charge coupled devices (CCD) as the image sensors. Before the charge of each pixel is transferred to an input node of a charge-to-voltage converter receiving the charge output by the CCD, the output node is reset to a reference value. The reference value is then sampled (first sampling interval). The pixel charge is then transferred to the output node, and the output node is sampled again (second sampling interval). The first sample is subtracted from the second sample, with the difference (voltage or current) representing the charge collected by the pixel.

It is often desirable that CDS be implemented while meeting the various requirements of the specific environments in which CDS is employed.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A sampling circuit provided according to an aspect of the present invention generates a difference of two voltages at a sampling node, with the second voltage representing the sum of an input signal and an offset, and the first voltage representing the offset alone. In an embodiment, a first capacitor is charged to the first voltage in a first phase. A second capacitor is then charged to the second voltage in a second phase. In a third phase, the first capacitor is coupled to the input terminal of an amplifier and the second capacitor is coupled between the input and output terminals of the amplifier to cause the amplifier to generate the difference of the first and second voltages.

The first capacitor has a capacitance much less than the second capacitor, thereby minimizing the noise power at the output of the amplifier, and requiring smaller implementation area.

According to another aspect of the present invention, a driver circuit may also be designed with capacitor values matching the first and second capacitors of above. In an embodiment, the driver circuit operates with a third capacitor and a fourth capacitor, each coupled between the input and output terminal of an amplifier, in the first and second phases respectively. The third capacitor has less capacitance than the fourth capacitor, and in the same ratio as the capacitance of the first and second capacitors.

Introduction of additional noise power at the output is minimized due to such use of the capacitors.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Environment

Figure 1:
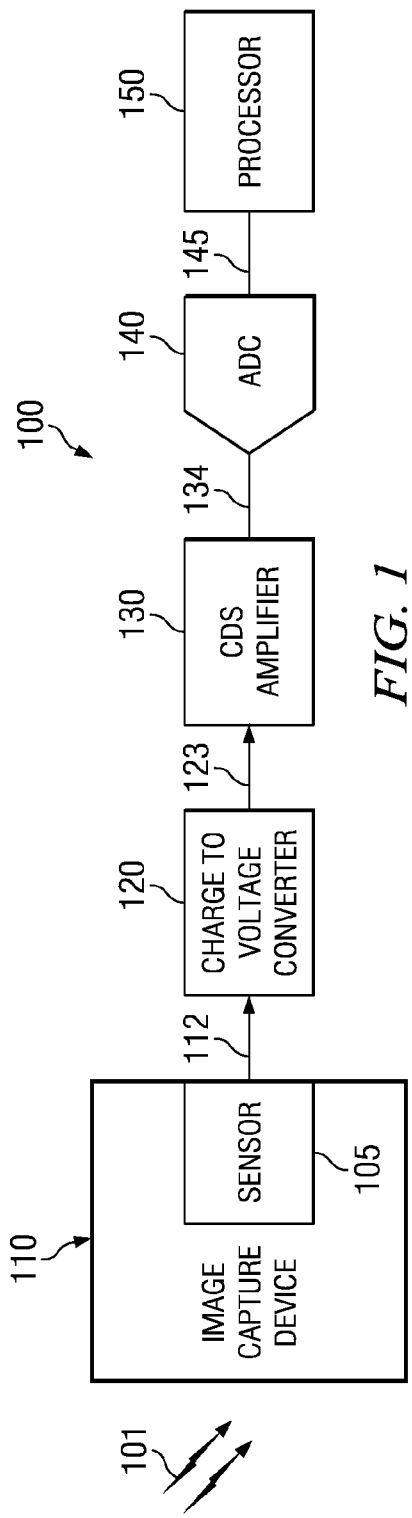
FIG. 1 is a block diagram of an example environment in which several aspects of the present invention can be implemented.

FIG. 1 is a block diagram of an example environment in which several aspects of the present invention can be implemented. Image processing system 100 is shown containing image capture device 110, sensor 105, charge to voltage converter 120, CDS amplifier 130, analog to digital converter (ADC) 140 and processor 150. The environment and the components of FIG. 1 are shown merely by way of illustration, and various aspects of the present invention can be implemented in other environments and using other components as well. For example, charge-to-voltage converter 120 may be replaced by an amplifier when sensor 105 is a charge coupled device (CCD), with corresponding modifications. Each component of FIG. 1 is described below in detail.

Image capture device 110 generates an image of a scene (represented by arrows 101), and is shown containing sensor 105, which may be, for example, a photodiode array. Image of scene 101 may be projected by a lens (not shown, but contained in image capture device 110) onto a charge collecting array contained in sensor 105, causing each element (pixel) in the array to accumulate an electric charge (or generate a current) proportional to the light intensity impinging on it. Once the array has been exposed to the light emanating from a source, a control circuit (not shown) causes the charge corresponding to each pixel to be shifted sequentially (for example, in response to a shift clock) through the array, and provided at corresponding time instances on path 112. The charge on path 112 at the corresponding time instances is referred to hereafter as the input signal 112.

Charge-to-voltage converter 120 operates to convert the charge received on path 112 to a corresponding voltage on node 123. As described in detail below with respect to an example embodiment, circuitry internal to Charge-to-voltage converter 120 may be reset prior to receiving a charge from path 112 (i.e., with input signal 112 decoupled from node 123). The reset operation may result in the generation of an offset/reference value (a non-signal component, i.e., not related to charge to be received on path 112, and often of unknown value) at the output 123 of Charge-to-voltage converter 120.

The offset on node 123 is sampled during one sampling interval, with signal 112 decoupled from Charge-to-voltage converter 120, and the strength of the offset is stored. During a subsequent interval, signal 112 is coupled to Charge-to-voltage converter 120 (and therefore to node 123), and node 123 is again sampled to store a sum of signal 112 and the offset on path 123. The two samples are provided to CDS amplifier 130 on path 123. Charge-to-voltage converter 120 may be regarded as a driving circuit that drives CDS amplifier 130.

CDS amplifier 130 generates as an output on path 134 a difference of the two samples received on path 123. The output on path 134 represents a sample of signal 112 alone, with the offset having been cancelled by the difference operation in CDS amplifier 130. The final sample may however contain added noise, which is minimized according to various aspects of the present invention as described below in further detail.

ADC 140 converts output samples received on path 134 to corresponding digital codes, and forwards the codes on path 145 to processor 150. Processor 150 may process the digital codes received on path 145 to perform various image processing operations.

As may be appreciated, the digital code ideally should be proportionate to the strength of the signal received on path 112 alone. However, any noise introduced by charge-to-voltage converter 120, the sampling processes, and/or CDS amplifier 130 may cause the digital values to be erroneous. Accordingly, it is generally desirable to reduce the noise introduced by at least such components. It may be further desirable to achieve such noise reduction while also meeting any other requirements such as reducing the implementation area of one or more of the components.

The combination of charge-to-voltage converter 120 and CDS amplifier 130 provided according to an aspect of the present invention addresses at least some of such requirements. The features of the present invention will be clearer in comparison with a prior implementation and accordingly, the description is continued with respect to an example prior implementation of charge-to-voltage converter and CDS amplifier.

3. Prior Technique

Figure 2:
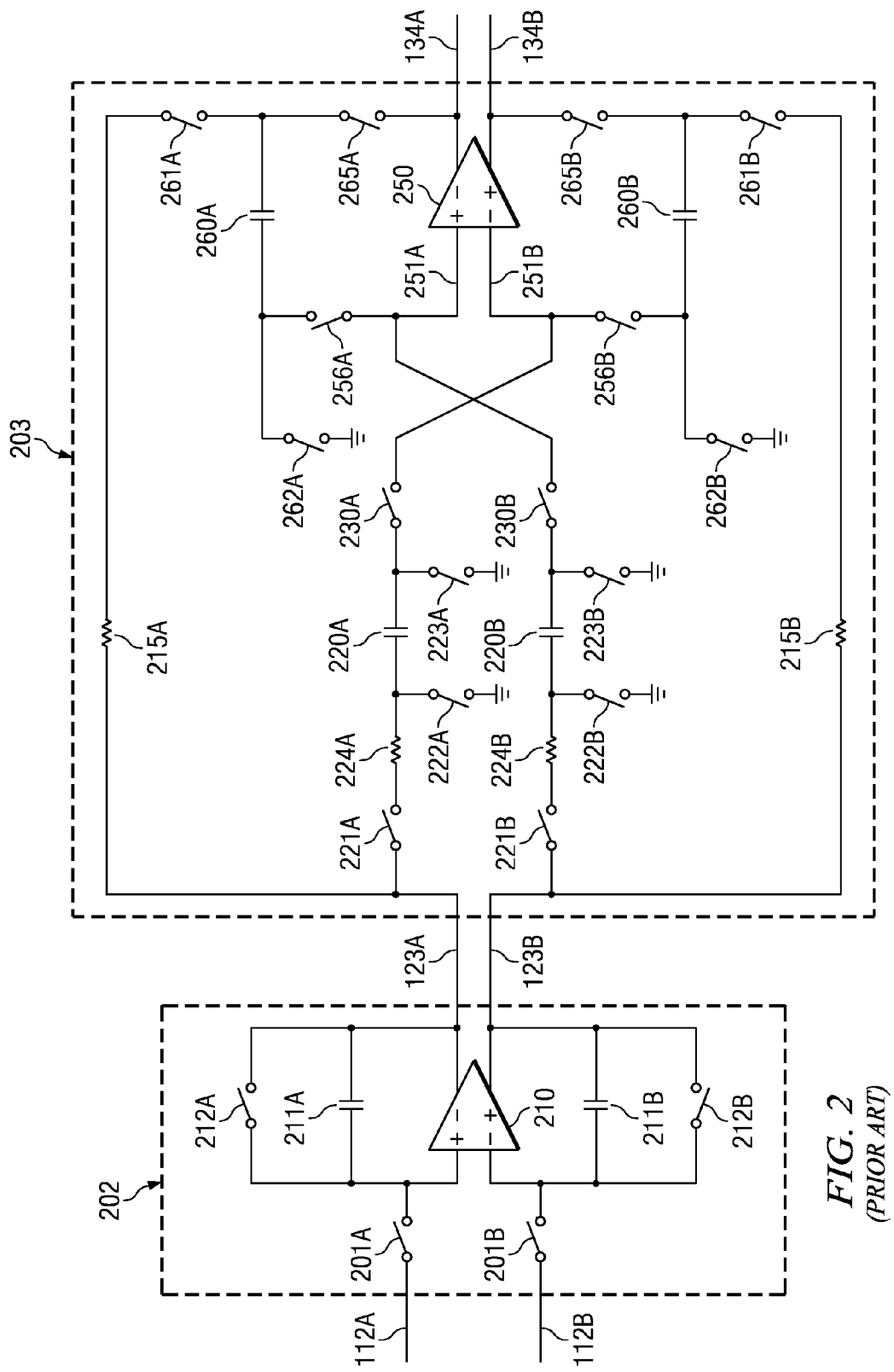
FIG. 2 is a circuit diagram illustrating the details of a charge-to-voltage converter and CDS amplifier according to a prior implementation processing differential signals

FIG. 2 is a circuit diagram illustrating the details of a charge-to-voltage converter and CDS amplifier according to a prior implementation processing differential signals. Although the example below is described as processing differential signals for illustrative purposes, other embodiments processing single-ended signals and/or implemented using other circuits/components can also be realized to provide similar features. The components as well as the operation of the circuit of FIG. 2 are described in detail below. Merely for ease of understanding, the components are described in the context of FIG. 1. Thus, differential paths 112A/112B, and 123A/123B are assumed to represent paths 112 and 123 of FIG. 1 respectively.

Charge-to-voltage converter 202 is shown containing operation amplifier (OPAMP) 210, switches 201A, 201B, 212A, 212B and capacitors 211A and 211B. CDS amplifier 203 is shown containing OPAMP 250, switches 221A, 221B, 222A, 222B, 223A, 223B, 230A, 230B, 262A, 262B, 256A, 256B, 261A, 261B, 265A and 265B, (sampling) capacitors 220A, 220B, 260A and 260B, and resistors 224A, 224B, 215A and 215B. Each of capacitors 211A and 211B has a capacitance Ci, while each of capacitors 220A, 220B, 260A and 260B has a capacitance C. The operation of the circuit of FIG. 2 is described next with respect to FIGS. 3A, 3B, 3C and the timing diagram of FIG. 4.

At time instance t1 (FIG. 4), switches 201A, 201B, 221A, 221B, 222A, 222B, 223A, 223B, 230A, 230B, 262A, 262B, 256A, 256B, 261A, 261B, 265A and 265B are open, while switches 212A and 212B are closed, to reset the (previously stored) charge on capacitors 211A and 211B to zero (reset operation of Charge-to-voltage converter 202 noted above, indicated as a "reset" phase in FIG. 4).

At time instance t2, switches 212A and 212B are opened, and switches 221A, 221B, 223A and 223B are closed. However, the charge on capacitors 211A and 211B may not be reset to zero (for example, due to charge injection from switches 212A, 212B and noise from these switches and OPAMP 210). As a result, an offset voltage V1 (non-signal component) is generated on nodes 123A/123B, and may be expressed by the following equation:

$$V1 = Qres/Ci \qquad \text{Equation 1}$$

wherein,

Qres is the residual charge on capacitors 211A or 211B,

Ci is the capacitance of each of capacitors 211A and 211B

Figure 3A:
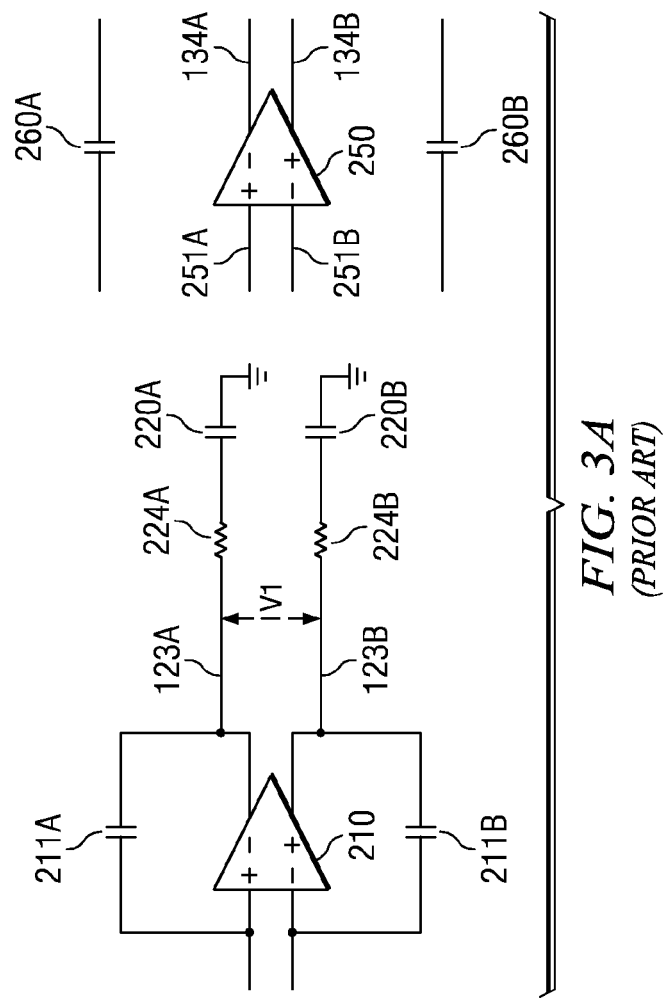
FIGS. 3A-3C are diagrams illustrating the internal circuit connections of the prior charge-to-voltage converter and CDS amplifier during various stages of operation.
Figure 3B:
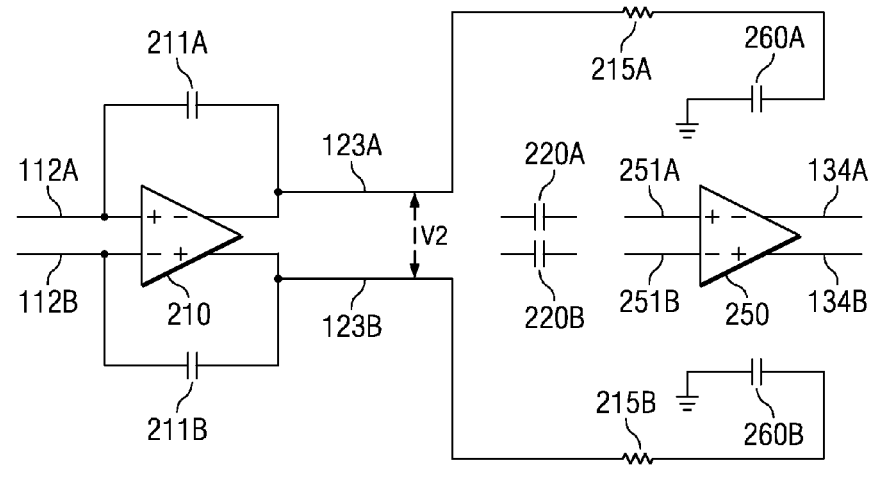
Figure 3C:
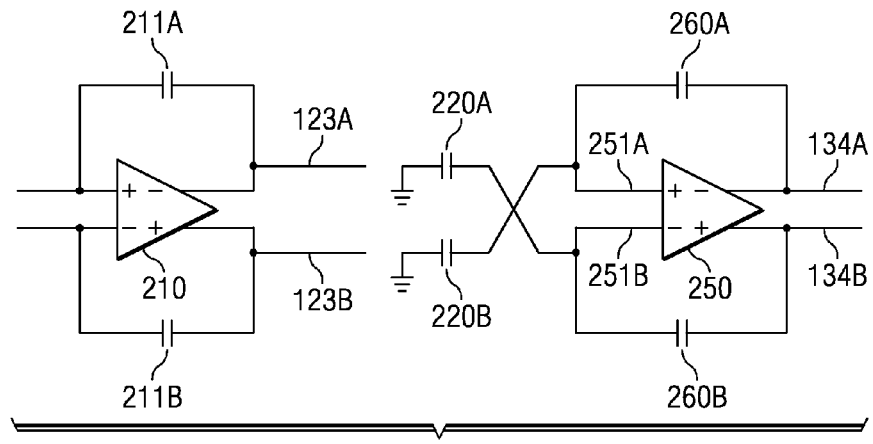

FIG. 3A shows a simplified diagram of FIG. 2 corresponding to the interval t2 to t3 (FIG. 4) as a result of the opening/closing of switches as noted above. The differential voltage V1 (equation 1) on node 123 (i.e., across nodes 123A/123B) is stored on capacitor pair 220A/220B during time interval t2-t3.

Resistors 224A/224B in conjunction with respective capacitors 220A/220B provides low pass filtering of voltage V1 to reduce noise. The values of resistors 224A, and 224B may be selected to achieve a desired level of low pass-filtering. However, such low pass filtering may be optional. Thus, during the interval from t2-t3, a sample V1 representing an offset voltage (non-signal component) on node 123 is stored, with input signal (path 112) being decoupled from node 123.

At time instance t3 (FIG. 4), switches 221A, 221B, 222A, 222B, 223A, 223B, 230A, 230B, 256A, 256B, 265A and 265B are open, while switches 201A, 201B, 261A, 261B, 262A and 262B are closed. The resulting circuit connections are shown in simplified form in FIG. 3B.

Input signal 112 is applied to Charge-to-voltage converter 202, which provides a differential voltage V2 on nodes 123A/123B. Differential voltage V2 is the sum of the offset voltage due to residual charge Qres (Equation 1), and charge Qsig representing input signal 112.

$$V2 = (Qres/Ci) + (Qsig/Ci) \qquad \text{Equation 2A}$$

$$V2 = V1 + (Qsig/Ci) \qquad \text{Equation 2B}$$

wherein, Qsig is the charge provided (by sensor 105) on path 112.

The differential voltage V2 (equation 2A/2B) across nodes 123A/123B is stored on capacitor pair 260A/260B during time interval t3-t4. Resistors 215A/215B, in conjunction with respective capacitors 260A/260B, provide low pass filtering of voltage V2 to reduce noise. The values of resistors 215A, and 215B may be selected to achieve a desired level of low pass-filtering. Thus, during the interval from t3-t4 a sample V2 representing a sum on node 123 of the offset voltage and input signal 112 is stored, with input signal (path 112) being coupled to node 123.

At time instance t4 (FIG. 4), switches 221A, 221B, 223A, 223B, 261A, 261B, 262A and 262B are open, while switches 222A, 222B, 230A, 230B, 256A, 256B, 265A and 265B are closed. The resulting circuit connections are shown in simplified form in FIG. 3C.

Figure 4:
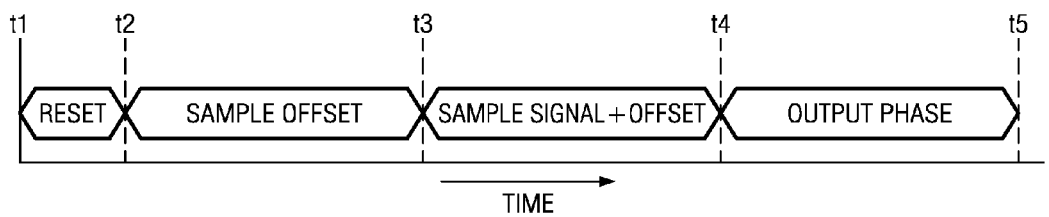
FIG. 4 is a timing diagram illustrating the operation of the circuit of FIG. 2.

Since capacitor pair 220A/220B previously (by time instance t3) stored a differential voltage V1, and capacitor pair 260A/260B previously (by time instance t4) stored a differential voltage V2, OPAMP 250 of CDS amplifier 203 generates difference of voltages V1 and V2 during the time interval t4-t5 (output phase indicated in FIG. 4).

Thus, at time instance t5, a voltage Qsig/Ci representing input signal 112 is provided on terminals 134A/134B. ADC 140 may sample the voltage and generate a corresponding digital code, as noted above.

The circuit described above may have several drawbacks, such as greater noise power generated at the output 134A/134B, larger implementation area etc, as described next.

With respect to CDS amplifier 203, it is noted that capacitors (220A/220B) in the input path of OPAMP 250 have the same capacitance values as capacitors (260A/260B) in the feedback path of OPAMP 250. Therefore, the feedback factor ($\beta$) of CDS amplifier 203 of FIG. 2 is equal to half (½). The relatively low feedback factor may result in greater noise power.

As an illustration, a (differential) noise voltage Vx across terminals 251A/251B results in a corresponding (differential) noise voltage 2Vx at the output 134A/134B. Therefore, in terms of power, the noise power gain of CDS amplifier 203 is 4. Thus the noise power spectral density (PSD) at the output is 4 times the noise at the corresponding input.

Secondly, assuming $\omega$ is the bandwidth of CDS amplifier 203 for a feedback factor $\beta$ of 1, the bandwidth for $\beta$ of ½ equals $\omega/2$. Therefore, the corresponding noise power at output 134 is $2\omega$PSD (total noise power=(noise PSD) times (bandwidth)), where noise PSD is the noise power spectral density at the input (input referred) of the amplifier 203. Further, due to the relatively lower bandwidth, the output 134 of CDS amplifier 203 may take a longer time to reach steady state (longer settling time).

Further, the noise voltage due to each of capacitors 220A, 220B, 260A and 260B is equal to kT/C, wherein k is Boltzmann's constant, T is the operating temperature in Kelvin, and C is the capacitance of each of capacitors 220A, 220B, 260A and 260B. Thus, a total noise of 4kT/C is generated at output 134A/134B due to the capacitors. Assuming, each of capacitors 220A, 220B, 260A and 260B requires an implementation area of "A", the total area for implementing the capacitors is 4A.

The parameters noted above are summarized below:
Feedback factor $\beta$=0.5
Noise PSD gain at output=4
Bandwidth=$\omega/2$
Output noise power=$2\omega$PSD
Thermal noise of switches sampled on capacitors=4kT/C
Implementation area for sampling capacitors=4A It may be desirable to implement CDS amplifier 203 such that output noise power is reduced, while also reducing the implementation area for the sampling capacitors. Several aspects of the present invention address one or more of the issues noted above, and as described next.

4. Improved CDS Technique

Figure 5:
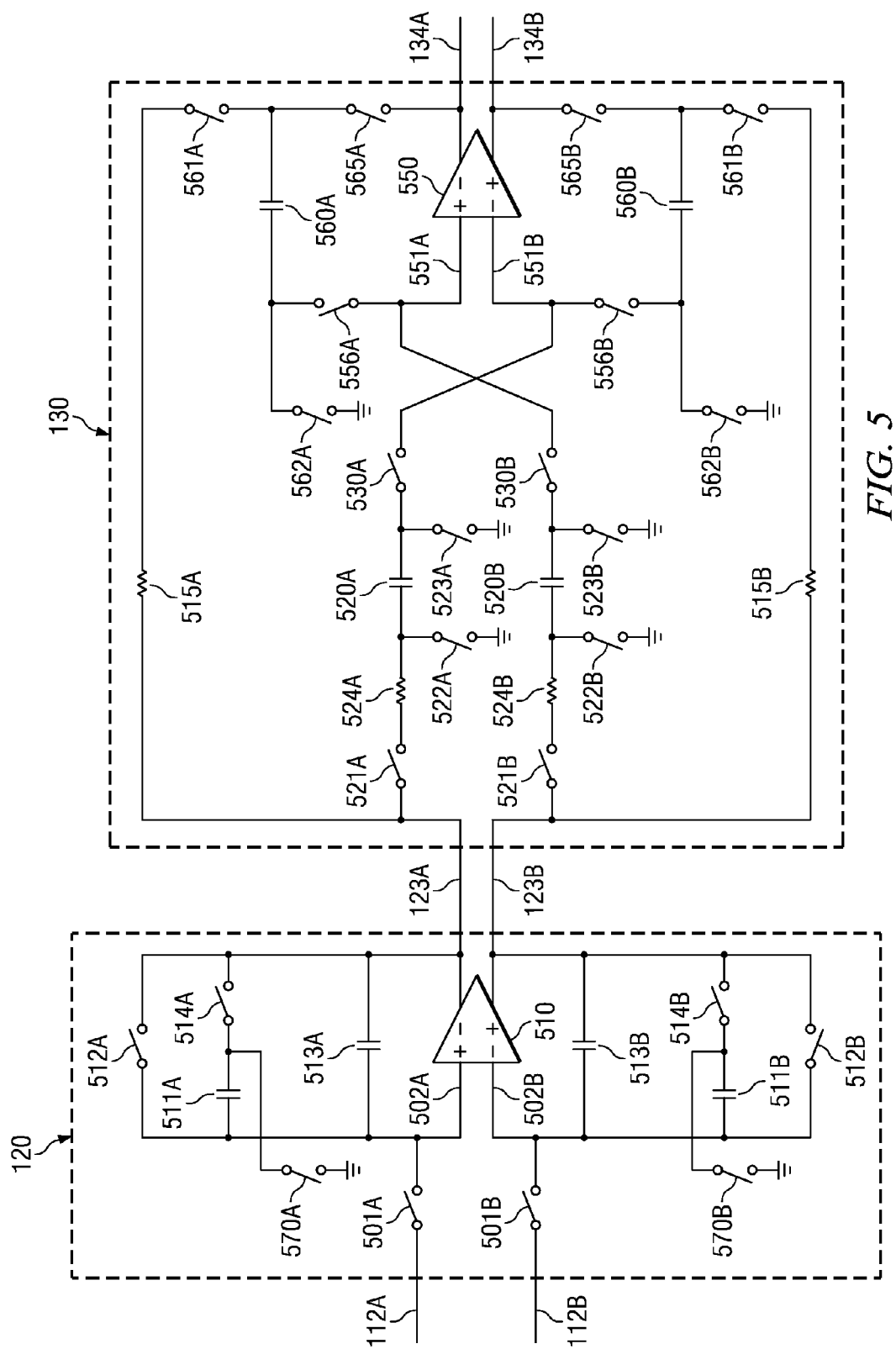
FIG. 5 is a circuit diagram illustrating the details of a charge-to-voltage converter and CDS amplifier in an embodiment of the present invention.

FIG. 5 is a circuit diagram illustrating the detail of a charge-to-voltage converter and CDS amplifier in an embodiment of the present invention. The components as well as the operation of the circuit of FIG. 5 are described in detail below. The diagram is shown containing charge-to-voltage converter 120 and CDS amplifier 130, which may together be considered a sampling circuit. Differential paths 112A/112B, and 123A/123B are assumed to represent paths 112 and 123 of FIG. 1 respectively. The ground terminals may be considered as reference terminals Charge-to-voltage converter 120 is shown containing OPAMP 510 ("second amplifier"), switches 501A, 501B, 512A, 512B, 514A, 514B, 570A, 570B and capacitors 511A, 511B, 513A and 513B. CDS amplifier 130 is shown containing OPAMP 550 ("first amplifier"), switches 521A, 521B, 522A, 522B, 523A, 523B, 530A, 530B, 562A, 562B, 556A, 556B, 561A, 561B, 565A and 565B, (sampling) capacitors 520A, 520B, 560A and 560B, and resistors 524A, 524B, 515A and 515B.

Terminals 502A and 502B are respectively the non-inverting and inverting input terminals of OPAMP 510. Terminals (nodes) 123A and 123B are respectively the inverting and non-inverting output terminals of OPAMP 510. Terminals 551A and 551B are respectively the non-inverting and inverting input terminals of OPAMP 550. Terminals (output nodes) 134A and 134B are respectively the inverting and non-inverting output terminals of OPAMP 550.

Charge-to-voltage converter 120 may be considered as a driver circuit driving CDS amplifier 130. Although, the description below is provided with respect to charge-to-voltage converter 120 as the driver circuit, it must be understood that other driver circuits can also be implemented in its place.

For illustration, it is assumed that each of capacitors 513A and 513B has a capacitance Cx, each of capacitors 511A and 511B has a capacitance Ci-Cx (wherein Ci/Cx=G, a gain factor, described below), each of capacitors 520A and 520B has a capacitance Ca, and each of capacitors 560A and 560B has a capacitance Cb. Capacitance value Ca is less than Cb for reasons described below. The operation of the circuit of FIG. 5 is described next with respect to FIGS. 6A, 6B, 6C and the timing diagram of FIG. 4.

At time instance t1 (FIG. 4), switches 501A, 501B, 521A, 521B, 522A, 522B, 523A, 523B, 530A, 530B, 562A, 562B, 556A, 556B, 561A, 561B, 570A, 570B, 565A and 565B are open, while switches 512A, 512B, 514A and 514B are closed, to reset the (previously stored) charge on capacitors 511A, 511B, 513A and 513B to zero. The state of the switches may be maintained till time instance t2.

However, the capacitors may not be completely discharged, and a residual charge may still be present on the capacitors at time instance t2 due to charge injection from switches 512A, 512B, and or/noise from amplifier 510 and switches 512A and 512B. At time instance t2, switches 512A, 512B, 514A and 514B are opened, and switches 521A, 521B, 570A, 570B, 523A and 523B are closed. The state of the switches may be maintained until t3.

Figure 6A:
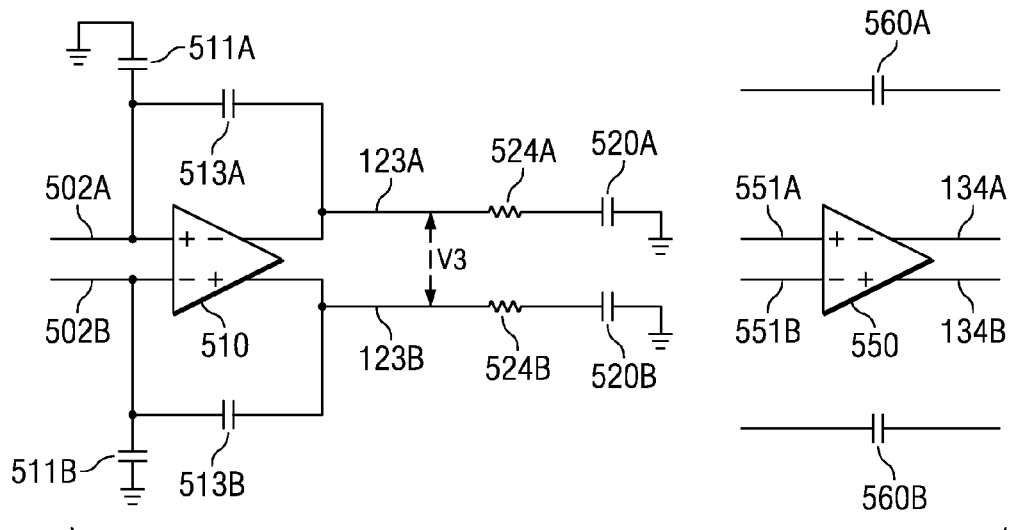
FIGS. 6A-6C are diagrams illustrating the internal circuit connections of a charge-to-voltage converter and CDS amplifier during various stages of operation in an embodiment of the present invention.
Figure 6B:
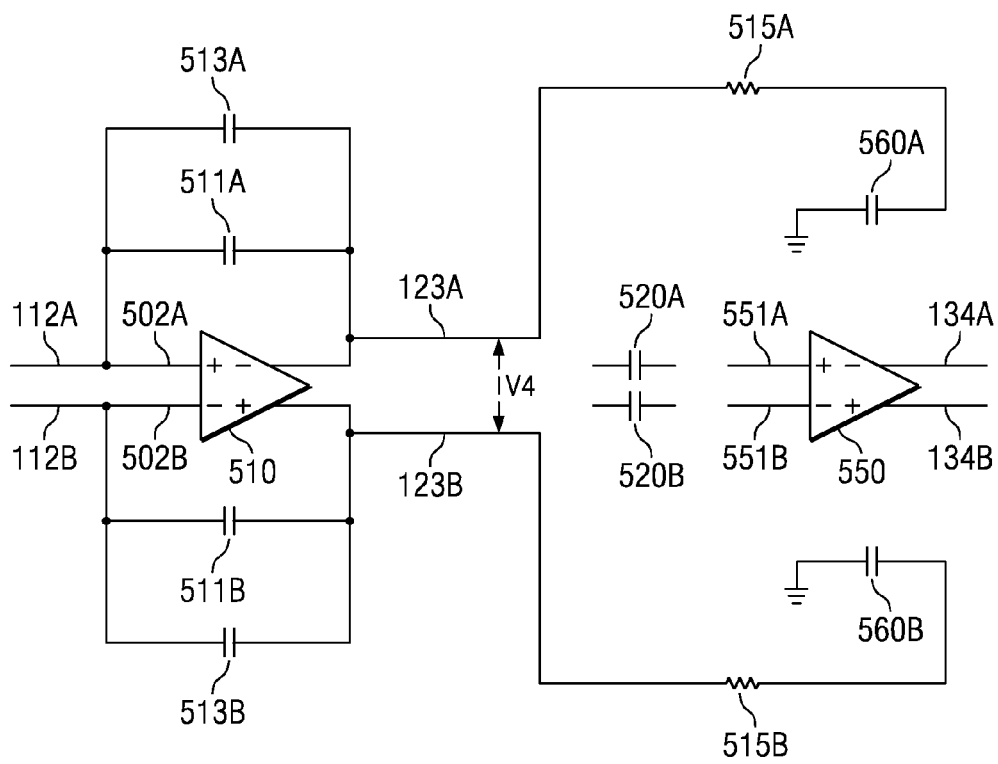
Figure 6C:
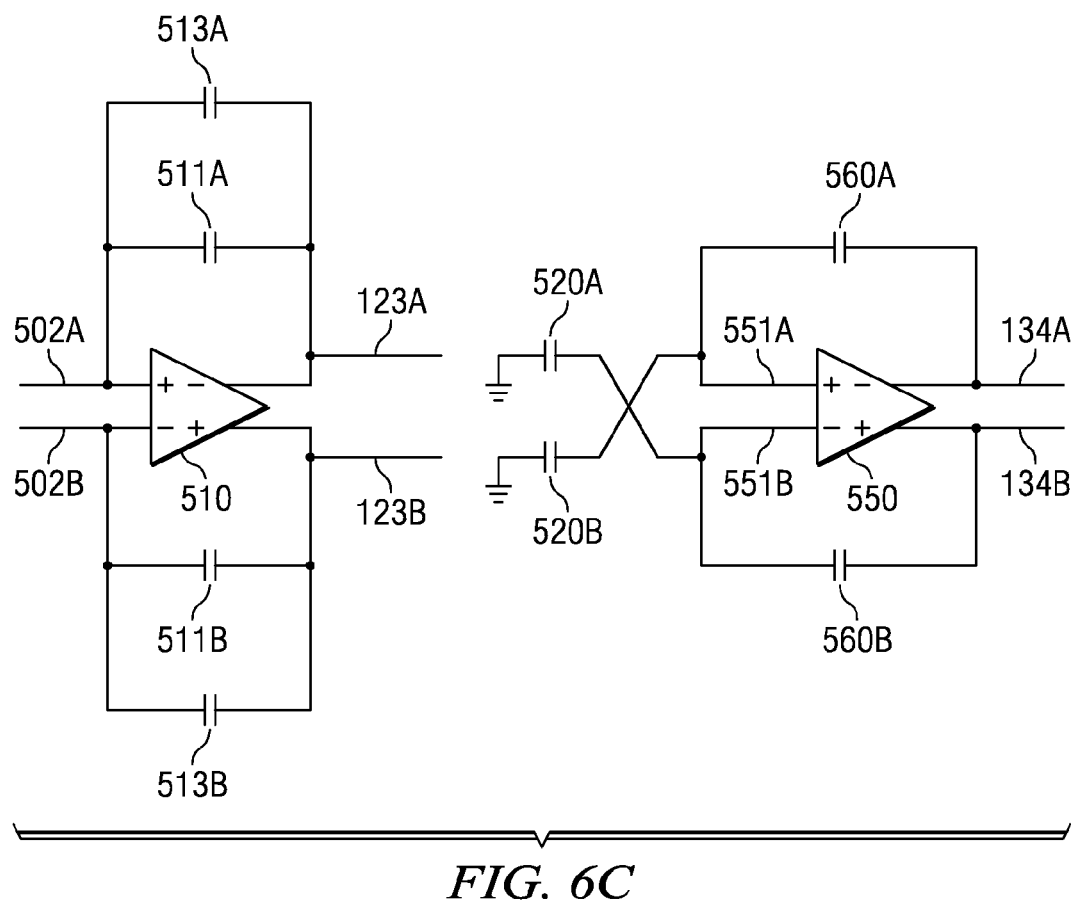

FIG. 6A shows the corresponding connections in the interval t2 to t3 as result of the opening/closing of switches as noted above. As a result, a differential voltage V3 on node 123 (i.e., across nodes 123A/123B), representing the residual charge noted above, is stored on capacitor pair 520A/520B during time interval t2-t3 (first phase).

Resistors 524A/524B in conjunction with respective capacitors 520A/520B provide low pass filtering of voltage V3 to reduce noise, and their values may be selected to achieve a desired level of low pass-filtering. Although, the example embodiment is described as employing low pass filtering as noted above, such low pass filtering may be optional, and the embodiment may be implemented without such low pass filter also. Thus, during the interval from t2-t3 a voltage V3 representing an offset voltage (non-signal component) on node 123 is stored, with input signal (path 112) being decoupled from node 123, the charge to voltage conversion being performed using a capacitance value of Cx.

At time instance t3 (FIG. 4), switches 521A, 521B, 522A, 522B, 523A, 523B, 570A, 570B, 530A, 530B, 556A, 556B, 565A and 565B are open, while switches 501A, 501B, 514A, 514B, 561A, 561B, 562A and 562B are closed. The switches are maintained in that stated until t4. The resulting circuit connections between t3 and t4 are shown in simplified form in FIG. 6B.

Input signal 112 is applied to charge-to-voltage converter 120, and charge-to-voltage converter 120 provides a voltage V4 developed on nodes 123A/123B. Differential voltage V4 is the sum of the offset voltage due to the residual charge noted above, and the charge representing input signal 112.

The differential voltage V4 across nodes 123A/123B is stored on capacitor pair 560A/560B during time interval t3-t4. Resistors 515A/515B in conjunction with respective capacitors 560A/560B provide low pass filtering of voltage V2 to reduce noise, (though such low pass filtering may optionally be absent, as noted above), and their values may be selected to achieve a desired level of low pass-filtering.

Thus, during the interval from t3-t4 (second phase) a sample V4 representing a sum on node 123 of voltages due to residual charge (causing an offset voltage) and input signal 112 is stored, with input signal (path 112) being coupled to node 123, and the charge to voltage conversion being performed with a capacitance Ci (parallel combination of Ci and Ci-Cx).

At time instance t4 (FIG. 4), switches 512A, 512B, 521A, 521B, 523A, 523B, 561A, 561B, 562A and 562B are open, while switches 522A, 522B, 530A, 530B, 556A, 556B, 565A and 565B are closed. The state of the switches may be maintained until t5. The resulting circuit connections are shown in simplified form in FIG. 6C. Capacitors 520A/520B are connected between the corresponding (differential) input terminals and ground (or any reference terminals), while Capacitors 560A/560B are connected as feedback capacitors between the corresponding (differential) output terminals and the input terminals.

Since capacitor pair 520A/520B (each having capacitance Ca) previously (by time instance t3) stored a differential voltage V3, and capacitor pair 560A/560B (each having capacitance Cb) previously (by time instance t4) stored a differential voltage V4, OPAMP 550 ("first amplifier", contained in CDS amplifier 130) generates a difference voltage Vout during the time interval t4-t5 (third phase or output phase indicated in FIG. 4), and is provided on output 134A/134B at t5.

The difference voltage Vout represents input signal 112, and contains lesser noise, as described next.

5. Theoretical Analysis

The following section provides a theoretical analysis of the circuit of FIG. 5, whose operation is described above.

Offset voltage V3 stored on capacitor pair 520A/520B in the (or at the end of) first phase may be expressed by Equation 3 below:

$$V3 = Qres/Cx \qquad \text{Equation 3}$$

wherein,

Qres is the total residual charge on capacitors (511A and 513A) together and (511B and 513B) together prior at time instance t2, Cx is the capacitance of each of capacitors 513A and 513B Voltage V4 stored on capacitor pair 560A/560B in the second phase may be expressed by Equation 4 below:

$$V4 = (Qres/Ci) + (Qsig/Ci) \qquad \text{Equation 4}$$

wherein, Qsig is the charge provided (by sensor 105) on path 112 during interval t3-t4).

Voltage Vout provided by CDS amplifier 130 at the end of the third phase may be expressed by Equation 5 below:

$$Vout = V4 - [(Ca/Cb)*V3] \qquad \text{Equation 5}$$

Substituting the expressions for V4 and V3 from equations 4 and 3 respectively provides Equation 6 below:

$$Vout = [(Qres/Ci) + (Qsig/Ci)] - [(Ca/Cb)*Qres/Cx] \qquad \text{Equation 6}$$

As noted above, Ci/Cx=G. Capacitances Cb and Ca are selected such that the ratio Ca/Cb equals 1/G. Equation 6 then simplifies to the following:

$$Vout = Qsig/Ci \qquad \text{Equation 7}$$

Therefore, the difference voltage Vout equals Qsig/Ci, and represents the charge due to input signal 112 alone (offset voltage removed), as desired.

The values of capacitances Ca and Cb are typically selected such that Ca is very small compared to Cb, i.e. the factor G is relatively large. In an embodiment of the present invention, G is selected to be 20. However, G can be made as large as possible. How large G may be made may be limited, for example, by constraints on the implementation of capacitors Ca and Cb.

With G being very large, the feedback factor ($\beta$) of OPAMP 550 of FIG. 5 in the third phase t4-t5 is approximately equal to 1. As a result, noise power at output 134, i.e., noise voltage added to the sample of input signal 112 represented by voltage Vout, is minimized As an illustration (and assuming a $\beta$ of 1), a (differential) noise voltage Vx across terminals 551A/551B results in a corresponding (differential) noise voltage also of value Vx at the output 134A/134B. Therefore, in terms of power, the noise power gain of CDS 130 is 1. Thus the noise power spectral density (PSD) at the output 134 is the same as that at the corresponding input 551.

Secondly, assuming a bandwidth of $\omega$ for a $\beta$ of 1, the bandwidth of CDS 130 equals $\omega$. Therefore, the corresponding noise power at output 134 is $\omega$PSD ($\omega$ times PSD, wherein, PSD is the power spectral density of noise at input terminals of amp 550).

Ignoring the capacitance Ca of capacitors 520A/520B (being much smaller than Cb), the noise voltage due to each of capacitors 560A and 560B is equal to kT/Cb, wherein k is Boltzmann's constant, T is the operating temperature in Kelvin, and Cb is the capacitance of each of capacitors 560A and 560B. Thus, a total noise of 2kT/Cb is generated at output 134A/134B due to the capacitors.

Further, ignoring the area of capacitors 520A/520B (capacitance Ca), implementation area required for capacitors 560A and 560B is 2A, assuming each of these capacitors requires an area of The parameters of CDS amplifier 130 noted above are summarized below:

Feedback factor $\beta=1$
Noise PSD gain at output=1
Bandwidth=$\omega$
Output noise power=$\omega$PSD
Thermal noise of switches sampled on capacitors=2kT/Cb=2kT/C (if Cb=C)
Implementation area for sampling capacitors=2A (if Cb=C)

It may now be appreciated that CDS amplifier 130 generates only half the noise power ($\omega$PSD) at output 134 compared to CDS amplifier 203 (2$\omega$PSD). Further, output 134 of CDS amplifier 130 settles much faster than in the case of CDS amplifier 203 due to the wider bandwidth ($\omega$ as against $\omega/2$)

In another embodiment, for obtaining the same noise performance as in the prior technique of FIG. 2, one can set Cb=C/2. Assuming the area of capacitors Ca to be negligible, with such an approach, the implementation area for the capacitors is A/2 (¼$^{th}$ of that of FIG. 2). OPAMP 510 needs to drive a smaller total capacitance (C/2 now as compared to C in FIG. 2). Therefore, the driving circuit of 120 may be implemented with smaller power requirements due to lesser load capacitor to be driven. Also, OPAMP 550 can be redesigned to have twice the input referred noise PSD of that of OPAMP 250 (of FIG. 2) so that it has the same output referred noise as that of OPAMP 250. This reduces power dissipated in OPAMP 550, thereby giving the same noise performance for substantial reduction in area and power, in comparison to the approach of FIG. 2.

Charge-to-voltage converter 120 and CDS amplifier 130 may advantageously be used in the image processing system of FIG. 1, and provide an improved correlated double sampling technique, with reduced noise power and implementation area.

6. CONCLUSION

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. An apparatus comprising:
    a charge-to-voltage converter having:
        a first operational amplifier having a first input terminal, a second input terminal, a first output terminal, and a second output terminal;
        a first capacitor that is coupled to the first input terminal of the first operational amplifier and the first output terminal of the first operational amplifier;
        a second capacitor that is coupled to the second input terminal of the first operational amplifier and the second output terminal of the first operational amplifier, wherein the capacitance of the first capacitor is approximately equal to the capacitor of the second capacitor;
        a third capacitor that is coupled to the first input terminal of the first operational amplifier;
        a fourth capacitor that is coupled to the second input terminal of the first operational amplifier, wherein the capacitance of the third capacitor is approximately equal to the capacitance of the fourth capacitor;
        a first switch that is coupled between the third capacitor and the first output terminal of the first operational amplifier;
        a second switch that is coupled between the fourth capacitor and the second output terminal of the first operational amplifier;
        a third switch that is coupled between the third capacitor and ground; and
        a fourth switch that is coupled between the fourth capacitor and ground; and
    a correlated double sample (CDS) amplifier having:
        a second operational amplifier having a first input terminal, a second input terminal, a first output terminal, and a second output terminal;
        a fifth capacitor that is coupled to the second input terminal of the second operational amplifier and to the first output terminal of the first operational amplifier;
        a sixth capacitor that is coupled to the first input terminal of the second operational amplifier and to the second output terminal of the first operational amplifier, wherein the capacitance of the fifth capacitor is approximately equal to the capacitance of the sixth capacitor;
        a third switch that is coupled to the first output terminal of the second operational amplifier;
        a fourth switch that is coupled to the second output terminal of the second operational amplifier;
        a fifth switch that is coupled to the first input terminal of the second operational amplifier;
        a sixth switch that is coupled to the second input terminal of the second operational amplifier;
        a seventh capacitor that is coupled between the third and fifth switches; and
        an eighth capacitor that is coupled between the fourth and sixth switches, wherein the capacitance of the seventh capacitor is approximately equal to the capacitance of the eighth capacitor, and wherein the ratio of the capacitance of the third capacitor to the capacitance of the first capacitor is approximately equal to the ratio of the capacitance of the fifth capacitor to the capacitance of the eighth capacitor.

2. The apparatus of claim 1, wherein the CDS amplifier further comprises:
    a seventh switch that is coupled to the seventh capacitor and to ground; and
    an eighth switch that is coupled to the eighth capacitor and to ground.

3. The apparatus of claim 1, wherein the CDS amplifier further comprises:
    a seventh switch that is coupled to the first output terminal of the first operational amplifier;
    an eighth switch that is coupled to the second output terminal of the first operational amplifier;
    a first resistor that is coupled to the seventh switch and to the fifth capacitor; and
    a second resistor that is coupled to the eighth switch and to the sixth capacitor.

4. The apparatus of claim 3, wherein the CDS amplifier further comprises:
    a ninth switch that is coupled to the first resistor and to ground; and
    a tenth switch that is coupled to the second resistor and to ground.

5. The apparatus of claim 1, wherein the CDS amplifier further comprises:
    a seventh switch that is coupled between the fifth capacitor and the second input terminal of the second operational amplifier; and
    an eighth switch that is coupled between the sixth capacitor and the first input terminal of the second operational amplifier.

6. The apparatus of claim 1, wherein the charge-to-voltage converter further comprises:
    a seventh switch that is coupled in parallel to the first capacitor; and
    an eighth switch that is coupled in parallel to the second capacitor.

* * * * *